United States Patent
Takei et al.

(10) Patent No.: US 7,361,718 B2
(45) Date of Patent: Apr. 22, 2008

(54) ALKALI-SOLUBLE GAP FILL MATERIAL FORMING COMPOSITION FOR LITHOGRAPHY

(75) Inventors: Satoshi Takei, Toyama (JP); Kazuhisa Ishii, Chiyoda-ku (JP); Shinya Arase, Funabashi (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 0 days.

(21) Appl. No.: 10/540,389

(22) PCT Filed: Dec. 25, 2003

(86) PCT No.: PCT/JP03/16735

§ 371 (c)(1),
(2), (4) Date: Jul. 20, 2005

(87) PCT Pub. No.: WO2004/061526

PCT Pub. Date: Jul. 22, 2004

(65) Prior Publication Data

US 2006/0041078 A1    Feb. 23, 2006

(30) Foreign Application Priority Data

Dec. 26, 2002    (JP)  ........................... 2002-376781

(51) Int. Cl.
C08F 212/02    (2006.01)
C08F 20/06    (2006.01)

(52) U.S. Cl. ............................... 526/307.5; 526/307.6; 526/317.1; 430/271.1; 430/270.1

(58) Field of Classification Search ............ 526/307.5, 526/317.1; 430/271.1, 270.1
See application file for complete search history.

(56) References Cited

U.S. PATENT DOCUMENTS

| | | | |
|---|---|---|---|
| 4,835,089 A | 5/1989 | Iwayanagi et al. | |
| 5,693,691 A | 12/1997 | Flaim et al. | |
| 5,919,599 A | * 7/1999 | Meador et al. | ......... 430/271.1 |
| 6,057,239 A | 5/2000 | Wang et al. | |

FOREIGN PATENT DOCUMENTS

| | | |
|---|---|---|
| EP | 1 150 343 A2 * | 10/2001 |
| EP | 1 315 045 A1 * | 5/2003 |
| JP | A 48-67447 | 9/1973 |
| JP | A 61-205494 | 9/1986 |
| JP | A 10-215893 | 8/1998 |
| JP | A 2001-83705 | 3/2001 |
| JP | A 2002-47430 | 2/2002 |
| WO | WO 02/05035 A1 | 1/2002 |

OTHER PUBLICATIONS

Lynch et al., "Properties and Performance of Near UV Reflectvity Control Layers," SPIE vol. 2195, pp. 225-229, 1994.
Taylor et al., "Methacrylate Resists and Antireflective Coatings for 193 nm Lithography," Part of the SPIE Conference on Advances in Resist Technology and Processing XVI, vol. 3678, pp. 174-185, Mar. 1999.
Meador et al., "Recent Progress in 193 nm Antireflective Coatings," Part of the SPIE Conference on Advances in Resist Technology and Processing XVL, vol. 3678; pp. 800-809; Mar. 1999.

* cited by examiner

*Primary Examiner*—Ling-Sui Choi
(74) *Attorney, Agent, or Firm*—Oliff & Berridge, PLC (57) ABSTRACT

There is provided a gap fill material forming composition for lithography that is used in dual damascene process and contributes toward an improvement in production efficiency. Concretely, it is a gap fill material forming composition characterized in that the composition is used in manufacture of semiconductor device by a method comprising coating a photoresist on a substrate having a hole with aspect ratio shown in height/diameter of 1 or more, and transferring an image to the substrate by use of lithography process, and that the composition is coated on the substrate prior to coating of the photoresist, and comprises a polymer having a hydroxy group or a carboxy group and a crosslinking agent. The gap fill material layer obtained from the gap fill material forming composition can be etched back with an alkaline aqueous solution.

11 Claims, 2 Drawing Sheets

ALKALI-SOLUBLE GAP FILL MATERIAL FORMING COMPOSITION FOR LITHOGRAPHY

TECHNICAL FIELD

The present invention relates to a novel gap fill material forming composition for lithography, more specifically to a gap fill material for lithography that is excellent in flattening property of substrates having unevenness like holes or trenches, is soluble in an alkaline aqueous solution, can be etched back with an alkaline aqueous solution, causes no intermixing with a photoresist layer, and provides an excellent resist pattern. Particularly, the present invention relates to a gap fill material forming composition for lithography for use in dual damascene process for introducing interconnect material Cu (copper) which has been used for reducing interconnection delay of semiconductor devices in recent years.

BACKGROUND ART

Conventionally, in the manufacture of semiconductor devices, micro-processing by lithography using a photoresist composition has been carried out. The micro-processing is a processing method including forming a thin film of a photoresist composition on a silicon wafer, irradiating actinic rays such as ultraviolet rays through a mask pattern on which a pattern for a semiconductor device is depicted, developing it to obtain a photoresist pattern, and etching the semiconductor substrate using the photoresist pattern as a protective film. However, in recent progress in high integration of semiconductor devices, there has been a tendency that shorter wavelength actinic rays are being used, i.e., KrF excimer laser beam (248 nm) has been taking the place of i-line (365 nm). Along with this change, influences of random reflection and standing wave off a substrate have become serious problems. Accordingly, it has been widely studied to provide an anti-reflective coating between the photoresist and the substrate (Bottom Anti-Reflective Coating, BARC).

As the anti-reflective coating, inorganic anti-reflective coatings made of titanium, titanium dioxide, titanium nitride, chromium oxide, carbon or α-silicon and organic anti-reflective coatings made of a light absorbing substance and a polymer compound are known. The former requires an installation such as a vacuum deposition apparatus, a CVD (chemical vapor deposition) apparatus or a sputtering apparatus. In contrast, the latter is considered advantageous in that it requires no special installation so that many studies have been made. For example, mention may be made of the acrylic resin type anti-reflective coating having a hydroxyl group being a crosslinking reaction group and a light absorbing group in the same molecule and the novolak resin type anti-reflective coating having a hydroxyl group being a crosslinking reaction group and a light absorbing group in the same molecule (see, for example U.S. Pat. Nos. 5,919,599 and 5,693,691).

The physical properties desired for organic anti-reflective coating materials include high absorbance to light and radioactive rays, no intermixing with the photoresist layer (being insoluble in photoresist solvents), no diffusion of low molecular substances from the anti-reflective coating material into the topcoat photoresist upon coating or heat-drying, and a higher dry etching rate than the photoresist (see, for example, Tom Lynch et al., "Properties and Performance of Near UV Reflectivity Control Layers", US, in Advances in Resist Technology and Processing XI, Omkaram Nalamasu ed., Proceedings of SPIE, 1994, Vol. 2195, p. 225-229; G. Taylor et al., "Methacrylate Resist and Antireflective Coatings for 193 nm Lithography", US, in Microlithography 1999: in Advances in Resist Technology and Processing XVI, Will Conley ed., Proceedings of SPIE, 1999, Vol. 3678, p. 174-185; and Jim D. Meador et al., "Recent Progress in 193 nm Antireflective Coatings, US, in Microlithography 1999: in Advances in Resist Technology and Processing XVI, Will Conley ed., Proceedings of SPIE, 1999, Vol. 3678, p. 800-809).

On the other hand, in LSI pattern rule having a fineness of 0.13 μm or less, interconnection delay largely influences speed-up of LSI, it becomes difficult to promote the improvement of the performance of LSI by the present LSI process technology. Thus, one material used for reducing interconnection delay is interconnect material Cu.

A technique for replacing Al as interconnect material with Cu is Dual Damascene process (see, for example U.S. Pat. No. 6,057,239). In the process, an anti-reflective coating is applied on a substrate with a higher aspect ratio (unevenness) than the conventional substrate for which interconnect material Al is used.

Characteristic properties required for anti-reflective coating material for use in Dual Damascene process include control of coating performance of anti-reflective coating on a substrate of the periphery of hole in addition to the above-mentioned properties. In addition, when an anti-reflective coating is applied in a constant thickness, the material is required to have a high absorbance for light or radiation and a high flattening property that does not depend on unevenness on a substrate.

However, it becomes difficult to use organic material for anti-reflective coating as anti-reflective coating material for use in Dual Damascene process. Therefore, it is thought a process in which two layers of an inorganic or organic anti-reflective coating having a high absorbance for light or radiation and a gap fill material for lithography for flattening are used. The gap fill material for lithography is Gap-Filling material, that is, a filler or a flattening agent. It is known a gap fill material forming composition in which a polymer solution effective for Dual Damascene process is used (see, for example WO 02/05035). Further, a certain composition for filling is also known (see, for example JP 2002-47430 A).

In the process in which a gap fill material is used, generally, the gap fill material composition is applied on a substrate having unevenness such as hole or the like, and baked to form a gap fill material layer. Thereafter, an excess gap fill material layer is removed by etching, that is, etch-back is carried out. The etch-back provides a gap fill material layer with a desired thickness, and makes possible to provide the surface of the gap fill material layer having a high smoothness. And, a photoresist layer is formed directly on the gap fill material layer or on an anti-reflective coating layer which is previously formed on the gap fill material layer, and then a manufacture of a substrate is carried out by a lithography process.

The etch-back is generally carried out by dry etching. In this case, a substrate on which a gap fill material layer is formed is moved from a coater & developer (a coating and developing apparatus) to a dry etching apparatus, and etched backed by dry etching, thereafter the substrate is required to be returned to the coater & developer in order to form an anti-reflective coating or a photoresist layer. That is, it is required to be moved between two apparatuses, therefore lowering in production efficiency occurs and is pointed out as a disadvantage in this process.

In order to overcome these disadvantages in the prior processes, the present inventors propose a process in which etch-back of a gap fill material layer is carried out by use of an alkaline aqueous solution. This process makes possible to carry out a series of steps comprising application of a gap fill material composition, etch-back and forming of a photoresist layer with a coater & developer apparatus (a coating and developing apparatus), and therefore production efficiency is greatly improved.

Characteristic properties required for gap fill material which makes etch-back by such an alkaline aqueous solution possible, that is, for an alkali-soluble gap fill material for lithography are as follows: a substrate with a high aspect ratio (unevenness) can be flattened; a gap fill material layer has a solubility (etch-back property) moderate for an alkaline aqueous solution; a gap fill material layer after etch-back is insoluble in a solvent used for an anti-reflective coating or a photoresist composition (no intermixing with an anti-reflective coating layer or a photoresist layer causes); there is no low molecular matter diffused from a gap fill material layer to an overlaid anti-reflective coating or photoresist layer upon heat-drying; and it has a higher dry etching rate than a photoresist.

An object of the present invention is to provide a novel gap fill material forming composition for lithography which can fully satisfy these requirements. The present invention provides a novel gap fill material forming composition for lithography which is excellent in flattening property of substrates having unevenness like holes or trenches, is soluble in an alkaline aqueous solution, can be etched back with an alkaline aqueous solution, causes no intermixing with a photoresist layer, and provides an excellent resist pattern. Particularly, the present invention provides a gap fill material forming composition for lithography for use in dual damascene process for introducing interconnect material Cu (copper) which has been used for reducing interconnection delay of semiconductor devices in recent years.

DISCLOSURE OF INVENTION

The present invention relates to the following aspects:
as a first aspect, a gap fill material forming composition characterized in that the composition is used in manufacture of semiconductor device by a method comprising coating a photoresist on a substrate having a hole with aspect ratio shown in height/diameter of 1 or more, and transferring an image to the substrate by use of lithography process, and that the composition is coated on the substrate prior to coating of the photoresist, and comprises a polymer having a hydroxy group or a carboxy group and a crosslinking agent;
as a second aspect, the gap fill material forming composition as described in the first aspect, wherein the polymer has a weight average molecular weight of 500 to 30000;
as a third aspect, the gap fill material forming composition as described in the first aspect, wherein the polymer is a polymer containing repeating unit having a hydroxy group or a carboxy group in main chain:
as a fourth aspect, the gap fill material forming composition as described in the first aspect, wherein the polymer is a polymer containing repeating unit having a hydroxy group or a carboxy group in side chain;
as a fifth aspect, the gap fill material forming composition as described in the first aspect, wherein the polymer is a polymer containing acrylic acid or methacrylic acid as repeating unit;
as a sixth aspect, the gap fill material forming composition as described in the first aspect, wherein the polymer is a polymer containing hydroxyalkyl acrylate or hydroxyalkyl methacrylate as repeating unit;
as a seventh aspect, the gap fill material forming composition as described in the first aspect, wherein the polymer is a dextrin ester compound;
as an eighth aspect, the gap fill material forming composition as described in the first aspect, wherein the polymer is a polymer containing hydroxystyrene as repeating unit;
as a ninth aspect, the gap fill material forming composition as described in any one of the first to seventh aspects, wherein the polymer has no aromatic ring structure in the structure;
as a tenth aspect, the gap fill material forming composition as described in the first aspect, wherein the crosslinking agent is a crosslinking agent having at least two crosslink-forming functional groups;
as an eleventh aspect, the gap fill material forming composition as described in any one of the first to tenth aspects, further containing an alkali-dissolution rate regulator;
as a twelfth aspect, a method for forming a gap fill material layer for use in manufacture of semiconductor device comprising coating the gap fill material forming composition as described in any one of the first to eleventh aspects on a substrate and baking it; and
as a thirteenth aspect, a gap fill material layer manufactured by coating the gap fill material forming composition as described in any one of the first to eleventh aspects on a semiconductor substrate and baking it, in which the gap fill material layer has a dissolution rate for an alkaline aqueous solution having a concentration of 0.1% to 20% ranging from 3 to 200 nm per second.

The present invention relates to a gap fill material forming composition for forming a gap fill material layer, the object of which is to confer flattening property on hole substrates. The gap fill material layer obtained from the gap fill material forming composition according to the present invention has not only a flattened surface of substrate and alkali-dissolution rate moderate for etch-back with an alkaline aqueous solution but also a high etching rate.

Further, the gap fill material layer of the present invention can fill and flatten unevenness of the substrate, and the etch-back with an alkaline aqueous solution can improve flattening property, therefore a coating to be applied thereon, such as photoresist can have improved uniformity of thickness.

The gap fill material forming composition of the present invention provides an excellent gap fill material layer for lithography which shows a high dry etching rate compared with a photoresist layer, cause no intermixing with the photoresist layer and occurs no diffusion into the photoresist upon heat-drying.

In addition, as the gap fill material layer formed from the gap fill material forming composition of the present invention can be etched back with an alkaline aqueous solution, steps from gap fill material layer forming to photoresist layer forming can be carried out with a coater & developer apparatus (a coating and developing apparatus). Thus, the process according to the present invention can omit a step of transferring to a dry etching apparatus which is required in the prior process. Consequently, the use of the gap fill material forming composition of the present invention permit an improvement of production efficiency.

BEST MODE FOR CARRYING OUT THE INVENTION

The present invention relates to a gap fill material forming composition characterized in that the composition is used in a manufacture of a semiconductor device by a method comprising coating a photoresist on a substrate having a hole with aspect ratio shown in height/diameter of 1 or more, and transferring an image to the substrate by use of lithography process, and that the composition is coated on the substrate prior to coating of the photoresist, and comprises a polymer having a hydroxy group or a carboxy group and a crosslinking agent. In addition, it relates to a gap fill material forming composition for lithography for use in dual damascene process for introducing interconnect material Cu (copper) used for reducing interconnection delay of semiconductor devices.

The gap fill material forming composition of the present invention basically comprises a polymer having a hydroxy group or a carboxy group, a crosslinking agent, and a solvent, and as arbitrary components a crosslinking catalyst, a surfactant, an alkali-dissolution rate regulator or the like. The solid content in the gap fill material forming composition of the present invention is for example 0.1 to 70 mass %, 0.1 to 50 mass %, or for example 0.5 to 50 mass %. In this specification, the solid content means all components in the gap fill material forming composition from which the solvent component is excluded.

The content of the polymer component having a hydroxy group or a carboxy group in the gap fill material forming composition according to the present invention is for example 1 to 99 mass %, for example 20 to 80 mass %, or for example 30 to 70 mass % in the solid content.

The polymer in the gap fill material forming composition according to the present invention includes several polymers, for example an addition polymer produced from monomers having addition polymerization unsaturated bond, such as acrylic acid or hydroxy styrene, a condensation polymer such as polyester, polyimide, polycarbonate, polycarbamate, polyamide, phenol resin or the like, a dextrin ester compound, and the like. In addition, the polymer is one containing a hydroxy group or a carboxy group in the structure. As such a polymer, several types of polymers such as a polymer in which a carboxy group or hydroxy group is directly bonded to a carbon atom constituting the main chain of the polymer and that is for example polyacrylic acid, polyvinyl alcohol or the like, or a polymer in which a carboxy group or hydroxy group is bonded to the side chain bonded to the main chain of the polymer and that is for example poly(2-hydroxyethyl) methacrylate or the like can be used.

The polymer in the present invention can be produced by polymerization of monomers having addition polymerization unsaturated bond containing a hydroxy group or a carboxy group.

The monomers having addition polymerization unsaturated bond include for example acrylic acid, methacrylic acid, hydroxystyrene, 4-vinylbenzylalcohol, 2-hydroxyethylacrylate, 2-hydroxypropylmethacrylate, vinyl alcohol, 2-hydroxyethylvinylether, 4-hydroxybutylvinylether, 4-carboxystyrene, vinyl acetate, pentenoic acid, 3-buten-1-ol, crotonic acid, 4-maleimide butanoic acid, N-(2-hydroxyethyl)maleimide and the like. For the production of the polymer in the present invention, a monomer or a combination of two or more monomers among these monomers can be used.

The polymer in the present invention can be also produced by polymerization of the above-mentioned monomer having addition polymerization unsaturated bond containing a hydroxy group or a carboxy group with a monomer having addition polymerization unsaturated bond containing no hydroxy group or carboxy group. The combined use of the monomer having addition polymerization unsaturated bond containing no hydroxy group or carboxy group makes possible to control solubility rate to an alkaline aqueous solution, glass transition temperature, solubility to a solvent, dry etching rate, adhesion with a substrate and resist poisoning resistance or the like of the resulting polymer.

The monomer having addition polymerization unsaturated bond containing no hydroxy group or carboxy group includes for example acrylic acid esters, methacrylic acid esters, crotonic acid esters, acrylamides, methacrylamides, styrenes, vinyl ethers, vinyl esters, maleimides and the like.

The acrylic acid esters include acrylic acid alkyl esters such as methyl acrylate, ethyl acrylate, isopropyl acrylate, hexyl acrylate, cyclohexyl acrylate, etc., acrylic acid aralkyl esters such as benzyl acrylate, (2-phenylethyl) acrylate, etc., acrylic acid aryl esters such as phenyl acrylate, naphthyl acrylate, etc., and the like.

The methacrylic acid esters include methacrylic acid alkyl esters such as methyl methacrylate, ethyl methacrylate, isobutyl methacrylate, pentyl methacrylate, cyclohexyl methacrylate, etc., methacrylic acid aralkyl esters such as benzyl methacrylate, (2-phenylethyl) methacrylate, etc., methacrylic acid aryl esters such as phenyl methacrylate, naphthyl methacrylate, etc., and the like.

The crotonic acid esters include crotonic acid alkyl esters such as methyl crotonate, ethyl crotonate, isopropyl crotonate, hexyl crotonate, cyclohexyl crotonate, glycerin monocrotonate, etc., crotonic acid aralkyl esters such as benzyl crotonate, (2-phenylethyl) crotonate, etc., crotonic acid aryl esters such as phenyl crotonate, naphthyl crotonate, etc., and the like.

The acrylamides include acrylamide, 2-acrylamide-2-methyl-1-propane sulfonic acid, (3-acrylamidepropyl) trimethylammonium chloride, acrylamide methyl cellulose acetate butyrate, and the like.

The methacrylamides include methacrylamide, 2-methacrylamide-2-methyl-1-propane sulfonic acid, (3-methacrylamidepropyl) trimethylammonium chloride, methacrylamide methyl cellulose acetate butyrate, and the like.

The styrenes include 4-methylstyrene, α-methylstyrene, chlorostyrene, bromostyrene, fluorostyrene, cyanostyrene, acetylstyrene, methoxystyrene, 4-vinylbenzamide, 4-vinyl methyl benzoate, and the like.

The vinyl ethers include ethylvinyl ether, 2-methoxyethylvinyl ether, 2-chloroethylvinyl ether, 2-methoxypropylene, N-(2-hydroxyethyl) piperidine, hexylvinyl ether, triethylene glycol methylvinyl ether, and the like.

The vinyl esters include for example vinyl acetate, vinyl chloroacetate, vinyl trifluoroacetate, vinyl hexanoate vinyl butyrate, vinyl isobutyrate, vinyl trimethyl acetate, and the like.

The maleimides include maleimide, N-phenylmaleimide, N-methylmaleimide, N-ethylmaleimide, N-propylmaleimide, N-benzylmaleimide, N-cyclohexylmaleimide, N-butylmaleimide, and the like.

In addition, other monomers having addition polymerization unsaturated bond, such as maleic anhydride, acrylonitrile, esters, ethers, etc. can be used.

The addition polymerization polymers in the present invention may be random polymers, block polymers or graft polymers. The polymers constituting the gap fill material forming composition for lithography according to the present invention can be synthesized by any method such as radical polymerization, anion polymerization, cation polymerization or the like. The production can be carried out in solution polymerization, suspension polymerization, emulsion polymerization, bulk polymerization or the like.

As the polymers in the present invention, condensation polymerization polymers having a hydroxy group or a carboxy group, such as polyester, polyimide, polycarbonate, polyamide, phenol resin, or the like, and dextrin ester compounds can be sued.

The phenol resin is obtained by polycondensation of phenols with aldehydes in the presence of an acid catalyst. The phenols used in this process include for example phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 3,4-xylenol, 3,5-xylenol, 2,3,5-trimethylphenol, 3,4,5-trimethylphenol, p-phenylphenol, hydroquinone, catechol, resorcinol, 2-methylresorcinol, pyrogallol, α-naphthol, β-naphthol, bisphenol A, dihydroxybenzoic acid ester, o-nitrophenol, m-nitrophenol, p-nitrophenol, o-chlorophenol, m-chlorophenol, p-chlorophenol, and the like. Among these compounds, phenol, o-cresol, m-cresol, p-cresol, 2,3-xylenol, 2,4-xylenol, 2,5-xylenol, 2,3,5-trimethylphenol, resorcinol, 2-methylresorcinol, and the like are preferable.

The aldehydes that are subjected to polycondensation with the phenols include for example formaldehyde, trioxane, paraformaldehyde, benzaldehyde, acetaldehyde, propylaldehyde, phenylaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, o-ethylbenzaldehyde, m-ethylbenzaldehyde, p-ethylbenzaldehyde, p-n-butylaldehyde, furfural, 1-naphthoaldehyde, 2-naphthoaldehyde, 2-hydroxy-1-naphthoaldehyde, and the like. Among them, formaldehyde is preferable.

In addition, the dextrin ester compounds are dextrin ester compounds that at least 50% of hydroxy groups of dextrin are converted into ester groups of formula (1):

(1)

Dextrin is a compound with a high molecular weight having a large number of hydroxy groups and having a low solubility to organic solvents. Therefore, it is difficult to use the compound for gap fill material forming compositions in which organic solvents are used. The dextrin ester compounds used in the gap fill material forming composition according to the present invention are improved in solubility to organic solvents by estrifying the hydroxy groups on dextrin. From viewpoint of having sufficient solubility to organic solvents, the dextrin ester compounds used in the gap fill material forming composition according to the present invention are dextrin ester compounds that at least 50% of hydroxy groups of dextrin are converted into ester groups of formula (1). Further, the dextrin ester compounds used in the gap fill material forming composition according to the present invention are dextrin ester compounds that at least 60% or at least 70% of hydroxy groups of dextrin are converted into ester groups of formula (1).

$R_1$ in formula (1) is $C_{1-10}$ alkyl group that may be substituted with hydroxy group, carboxy group, cyano group, nitro group, $C_{1-6}$ alkoxy group, fluorine atom, chlorine atom, bromine atom, iodine atom or $C_{1-6}$ alkoxycarbonyl group, or phenyl, naphthyl or anthryl group that may be substituted with $C_{1-6}$ alkyl group, hydroxy group, carboxy group, cyano group, nitro group, $C_{1-6}$ alkoxy group, fluorine atom, chlorine atom, bromine atom, iodine atom or $C_{1-6}$ alkoxycarbonyl group. The alkyl group includes for example methyl, ethyl, isopropyl, n-pentyl, cyclohexyl and n-octyl, and the like. The alkoxy group include for example methoxy, ethoxy, isopropyloxy and cyclohexyloxy, and the like. The alkoxycarbonyl group includes for example methoxycarbonyl, ethoxycarbonyl and cyclohexyloxycarbonyl, and the like.

From viewpoint of solubility of gap fill material layer to an alkaline aqueous solution, $R_1$ is preferably carboxyalkyl group such as carboxymethyl, carboxyethyl and carboxybutyl, etc., carboxyphenyl and carboxynaphthyl, and the like.

The dextrin ester compounds used in the gap fill material forming composition of the present invention can be produced for example according to the followings.

First of all, starch is hydrolyzed to dextrin by a known process such as an acid, an alkali, an enzyme, heating or the like. For example, processes disclosed in JP-A 48-67447 or JP-A 61-205494, and the like can be mentioned. In addition, processes through alkaline hydrolysis and enzymatic liquefaction disclosed in JP-A 10-215893, and the like can be mentioned. The molecular weight of dextrin can be controlled by reaction temperature, pH of reaction solution and the amount of enzyme added, etc. The aimed dextrin can be obtained by purification through process with ion exchange resin, preparative column, re-precipitation or the like.

The conversion of the resulting dextrin to a dextrin ester compound can be carried out by converting hydroxy groups into ester groups through a reaction of the dextrin with a carboxylic acid derivative such as an acid chloride, an acid bromide, a carbonylimidazole compound, a carboxylic acid active ester compound and an acid anhydride, etc. For example, the conversion of hydroxy groups of dextrin into acetoxy groups can be carried out by reaction with acetylchloride or acetic anhydride under a condition of using a base such as pyridine or the like.

The conversion of hydroxy group into ester group can be carried out by using an acid chloride, an acid bromide, a carbonylimidazole compound, a carboxylic acid active ester compound derived from a carboxylic acid compound such as acetic acid, propionic acid, butyric acid, cyclohexane carboxylic acid, chloroacetic acid, trifluoroacetic acid, cyanoacetic acid, ethoxyacetic acid, isobutyric acid, succinic acid, maleic acid, phthalic acid, benzoic acid, bromobenzoic acid, hydroxybenzoic acid, iodobenzoic acid, nitrobenzoic acid, methylbenzoic acid, ethoxybenzoic acid, tert-butoxybenzoic acid, naphthalene carboxylic acid, chloronaphthalene carboxylic acid, hydroxynaphthalene carboxylic acid and anthracene carboxylic acid, and the like. The anhydrides of these carboxylic acid can be also used. Further, the conversion of hydroxy group of dextrin into ester group can be carried out by reacting dextrin with the above-mentioned carboxylic acid compound in the presence of a condensation agent such as dicyclohexylcarbodiimide.

The conversion of hydroxy group into ester group can be carried out by using carboxylic acid derivative such as an acid chloride, an acid bromide, a carbonylimidazole compound, a carboxylic acid active ester compound and acid anhydride, and the like in only alone or in a combination of two or more.

The proportion of the conversion of hydroxy group of dextrin into ester group can be controlled by altering the equivalent weight of carboxylic acid derivative used, such as an acid chloride, an acid bromide, a carbonylimidazole compound, a carboxylic acid active ester compound and acid anhydride, and the like.

The measurement of the amount of hydroxy groups remaining on dextrin can be carried out by for example titrating with 1 N sodium hydroxide aqueous solution and detecting the end point in the inflection point at pH 8-11 with a pH meter.

The dextrin ester compounds used in the gap fill material forming composition according to the present invention include those having straight chain structure and those having branched structure both of which may be used. The branched structure comes from the branched structure (amylopectin) of starch.

The weight average molecular weight of the above-mentioned polymer used in the gap fill material forming composition according to the present invention is for example 500 to 30000, for example 500 to 20000, or for example 1000 to 15000.

In case where the polymer has a weight average molecular weight less than 500, it is difficult to obtain a gap fill material layer in an amorphous state, and further it is liable to be sublimed in the baking step after applying the gap fill material forming composition. Therefore, it is assumed that it causes disadvantages such as a formation of incomplete gap fill material layer, pollution of apparatus, and the like. In case where the polymer has a weight average molecular weight more than 30000, the polymer occurs lowering in flowability of the gap fill material forming composition, and thus causes insufficient filling into holes formed on a substrate, void and gap in the holes, and finally problems in the processing of the substrate.

The content of the crosslinking agent in the gap fill material forming composition according to the present invention is for example 1 to 99 mass %, for example 20 to 80 mass % or for example 30 to 70 mass % in the solid content.

The crosslinking agent in the gap fill material forming composition according to the present invention includes melamines and substituted ureas, or polymer compounds having epoxy groups, and the like. Preferable crosslinking agents are compounds such as methoxymethylated glycoluril or methoxymethylated melamine, etc., more preferably tetramethoxymethyl glycoluril or hexamethoxymethyl melamine. In addition, preferably, it is glycidylether compounds, particularly preferably epoxidized butane tetracarboxylic acid tetrakis(cyclohexenylmethyl) modified caprolactone, glycerol polyglycidyl ether, sorbitol polyglycidyl ether, diglycidyl phthalate and the like.

The above-mentioned crosslinking agents can occur crosslinking reaction among the crosslinking agents or with the polymer component having a hydroxy group or carboxy group when a gap fill material layer is formed after applying the gap fill material forming composition on a substrate, and thereby the formed gap fill material layer can be lowered in a solubility to organic solvents.

On the gap fill material layer formed from the gap fill material forming composition of the present invention, an anti-reflective coating composition or a photoresist composition is applied in the following lithography process. At this point, if the gap fill material layer is dissolved in organic solvents generally used for anti-reflective coating or photoresist compositions, for example ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutyrate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, etc., an intermixing between the gap fill material layer and the anti-reflective coating or photoresist layer occurs and leads to adverse effects such as lowering in resolution in the following lithography process. In the gap fill material forming composition of the present invention, any intermixing that causes the adverse effects can be inhibited by the above-mentioned crosslinking reaction.

The gap fill material forming composition of the present invention can contain any alkali-dissolution rate regulators. The alkali-dissolution rate regulator means a compound by which dissolution rate to an alkaline aqueous solution of the gap fill material layer formed from the gap fill material forming composition can be regulated. The dissolution rate of the gap fill material layer to an alkaline aqueous solution can be controlled by selecting the kind of the alkali-dissolution rate regulator or the added amount thereof.

The alkali-dissolution rate regulator includes naphthoquinone compounds, compounds having t-butoxycarbonyl group, compounds having hydroxy group, compounds having carboxy group, compounds having phenyl group. The added amount of the alkali-dissolution rate regulator is 100 mass parts or less, preferably 80 mass parts or less, or 50 mass parts or less based on 100 mass parts of the polymer.

To the gap fill material forming composition according to the present invention, as catalyst for promoting the above-mentioned crosslinking reaction, acid compounds, such as p-toluenesulfonic acid, trifluoromethanesulfonic acid, pyridinium p-toluenesulfonate, salicylic acid, sulfosalicylic acid, citric acid, benzoic acid, hydroxybenzoic acid, etc. and/or thermal acid generators, such as 2,4,4,6-tetrabromocyclohexadienone, benzointosylate, 2-nitrobenzyltosylate, etc. can be added. The added amount thereof is for example 0.01 to 30 mass parts, for example 0.1 to 30 mass parts, or for example 0.5 to 20 mass parts based on 100 mass parts of the crosslinking agent although it is altered depending on the added amount or kind of the polymer, or the added amount or kind of the crosslinking agent.

The gap fill material forming composition according to the present invention may contain further rheology controlling agents, adhesion auxiliaries, surfactants, etc. in addition to the above described ones, if necessary.

The rheology controlling agents are added mainly aiming at increasing the flowability of the gap fill material forming composition and in particular in the baking step, increasing fill property of the gap fill material forming composition into the inside of holes. Specific examples thereof include phthalic acid derivatives such as dimethyl phthalate, diethyl phthalate, diisobutyl phthalate, dihexyl phthalate or butyl isodecyl phthalate; adipic acid derivatives such as di-n-butyl adipate, diisobutyl adipate, diisooctyl adipate or octyldecyl adipate; maleic acid derivatives such as di-n-butyl maleate, diethyl maleate or dinonyl maleate; oleic acid derivatives such as methyl oleate, butyl oleate or tetrahydrofurfuryl oleate; or stearic acid derivatives such as n-butyl stearate or glyceryl stearate. The rheology controlling agents are blended in proportions of usually less than 30 mass % in the gap fill material forming composition.

The adhesion auxiliaries are added mainly for the purpose of increasing the adhesion between a substrate, or antireflective coating or a photoresist layer and a gap fill material layer formed from a gap fill material forming composition, in particular preventing the detachment in development. Specific examples thereof include chlorosilanes such as trimethylchlorosilane, dimethylvinylchlorosilane, methyldiphenylchlorosilane or chloromethyldimethyl chlorosilane; alkoxysilanes such as trimethylmethoxysilane, dimethyldiethoxysilane, methyldimethoxysilane, dimethylvinylethoxysilane, γ-methacryloxypropyltrimethoxysilane, diphenyldimethoxysilane or phenyltriethoxysilane; silazanes such as hexamethyldisilazane, N,N'-bis(trimethylsilyl)urea, dimethyltrimethylsilylamine or trimethylsilylimidazole; silanes such as vinyltrichlorosilane, γ-chloropropyltrimethoxysilane, γ-aminopropyltriethoxysilane, γ-glycidoxypropyltrimethoxysilane or γ-methacryloxypropyltrimethoxysilane; heterocyclic compounds such as benzotriazole, benzimidazole, indazole, imidazole, 2-mercaptobenzimidazole, 2-mercaptobenzothiazole, 2-mercaptobenzoxazole, urazole, thiouracyl, mercaptoimidazole or mercaptopyrimidine; ureas such as 1,1-dimethylurea or 1,3-dimethylurea, or thiourea compounds. The adhesion auxiliaries are added in proportions of usually less than 10 mass %, preferably less than 5 mass %, based on the total amount of the gap fill material forming composition.

The gap fill material forming composition according to the present invention may contain surfactants with view to preventing the occurrence of pinholes or striations and further increasing coatability not to cause surface unevenness. As the surfactants, mention may be made of, for example, nonionic surfactants such as polyoxyethylene alkyl ethers, e.g., polyoxyethylene lauryl ether, polyoxyethylene stearyl ether, polyoxyethylene cetyl ether, polyoxyethylene oleyl ether, etc., polyoxyethylene alkyl allyl ethers, e.g., polyoxyethylene octyl phenol ether, polyoxyethylene nonyl phenol ether, etc.; polyoxyethylene/polyoxypropylene block copolymers, sorbitan fatty acid esters, e.g., sorbitan monolaurate, sorbitan monopalmitate, sorbitan monostearate, sorbitan monooleate, sorbitan trioleate, sorbitan tristearate, etc., polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, etc.; fluorine based surfactants, e.g., trade name: EFTOP EF301, EF303, EF352 (manufactured by Tochem Products Co., Ltd.), trade name: MEGAFAC F171, F173, R-08, R-30 (manufactured by Dainippon Ink and Chemicals, Inc.), trade name: FLUORAD FC430, FC431 (manufactured by Sumitomo 3M Limited), trade name: ASAHI GUARD AG710, SURFLON S-382, SC101, SC102, SC103, SC104, SC105, SC106 (manufactured by Asahi Glass Co., Ltd.); organosiloxane polymer KP341 (manufactured by Shinetsu Chemical Co., Ltd.), etc. The blending amount of the surfactants is usually 0.2 mass % or less, preferably 0.1 mass % or less, in the gap fill material forming composition according to the present invention. The surfactants may be added singly or two or more of them may be added in combination.

The gap fill material forming composition of the present invention is preferably used in a solution state, and several solvents are used therefor. As the solvents for dissolving the above-described polymer compound, crosslinking agent and the like, use may be made of ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methylpyruvate, ethyl pyruvate, ethyl acetate, butyl acetate, ethyl lactate, butyl lactate, etc. The organic solvents may be used singly or in combination of two or more of them. Further, high boiling solvents such as propylene glycol monobutyl ether or propylene glycol monobutyl ether acetate, etc. may be mixed.

The gap fill material forming composition according to the present invention is used in a manufacture process of semiconductor devices by using substrate having holes with an aspect ratio shown in height/diameter of 1 or more, particularly in a lithography process of dual damascene process. Hereinafter, a process in which the gap fill material forming composition according to the present invention is used is shown (FIG. 1).

Figure 1:
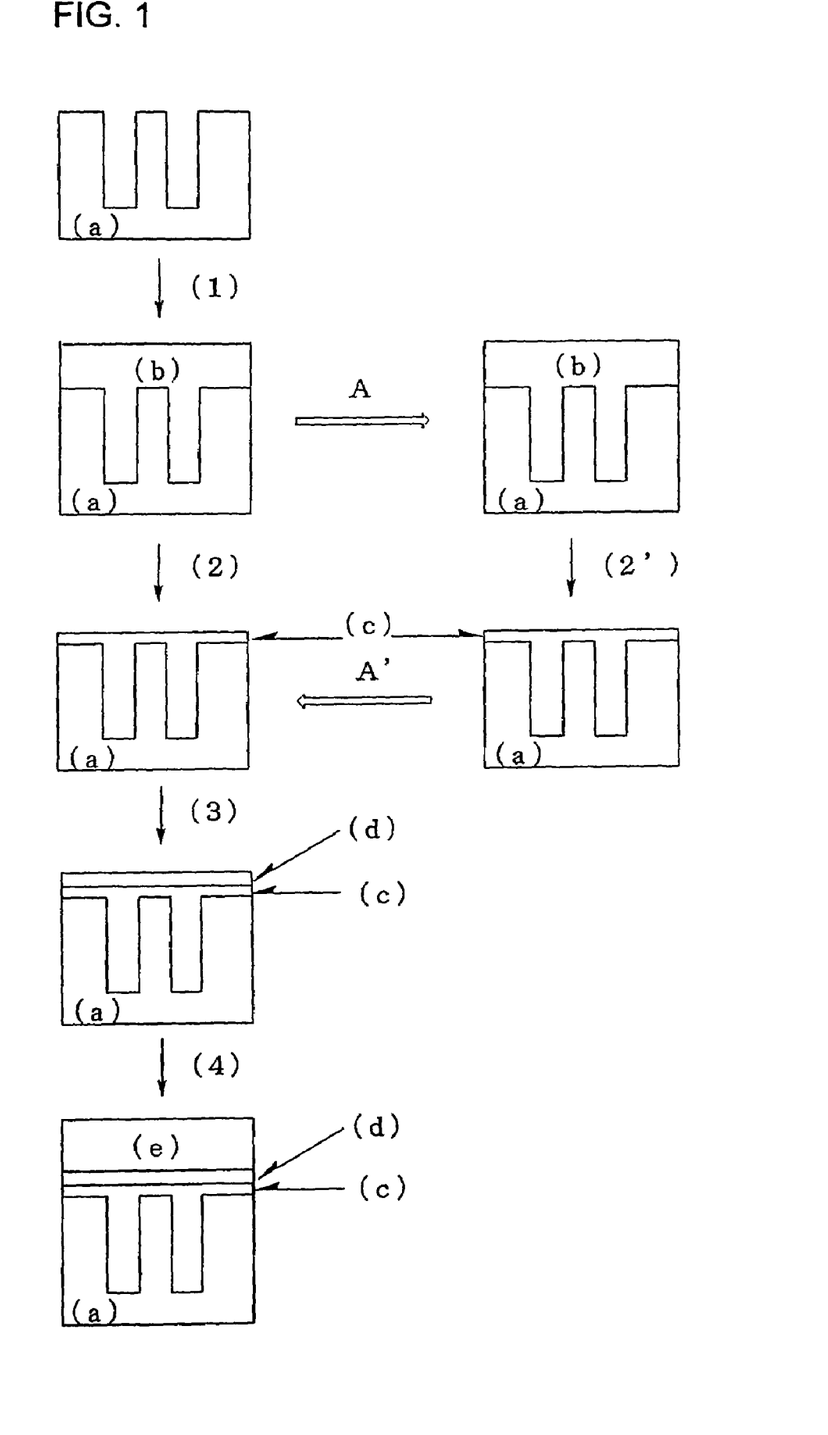
FIG. 1 is a schematic view showing a production process by using a gap fill material forming composition according to the present invention.

On a substrate having holes with an aspect ratio shown in height/diameter of 1 or more (for example, silicon/silicon dioxide coat substrate, silicon nitride substrate, glass substrate, ITO substrate or the like), the gap fill material forming composition of the present invention is coated by a suitable coating method, for example, with a spinner, a coater or the like, and thereafter the substrate is baked to fabricate a gap fill material layer (Step (1) in FIG. 1). The conditions of baking are suitably selected from baking temperature of 60 to 220° C. and baking time of 0.3 to 120 minutes. On coating, an excess amount of the gap fill material forming composition is used in order to secure fill of the gap fill material forming composition into the holes, and thus the resulting gap fill material layer becomes a thick film (0.01 to 5 μm as the film thickness on the substrate). In substrates having a part where holes are present densely and a part where holes are present thinly, there may cause a difference in the film thickness of the gap fill material layer on the substrate due to the difference of density of holes. In order to minimize the difference, an excess amount of the gap fill material forming composition may be used and applied in a thick coating.

As there are problems such as resolution or the like in the following lithography process by using the gap fill material layer in a thick film, an excess gap fill material layer is removed by etching, that is, etch-back is carried out. As the gap fill material layer of the present invention is soluble in an alkaline aqueous solution, etch-back is carried out with an alkaline aqueous solution (Step (2) in FIG. 1). In this etch-back step with an alkaline aqueous solution, the resulting gap fill material layer can be controlled to a desired film thickness by selecting the kind or concentration of alkaline aqueous solution used, or the time for etch-back, etc. In addition, the flatness of surface of gap fill material layer can be improved by etch-back. After etch-back, a baking process may be added under a condition selected suitably from baking temperature of 100 to 220° C. and baking time of 0.3 to 120 minutes.

Then, on the gap fill material layer after etch-back, a formation of an anti-reflective coating layer (Step (3) in FIG. 1) and a formation of a photoresist layer (Step (4) in FIG. 1) are carried out, thereafter a substrate processing and the like are carried out by exposure to light, development and dry etching.

In Steps (1) to (4) in FIG. 1 by using the gap fill material forming composition of the present invention, a series of steps (Steps (1) to (4)) can be carried out by a coater & developer (a coating and developing apparatus) commonly used because the gap fill material layer can be etched back with an alkaline aqueous solution.

As conventional gap fill material layers could not be etched back with any alkaline aqueous solutions, etch-back has been carried out by dry etching. Therefore, it has been required to transfer substrates. That is, it has been required to transfer a substrate from a coater & developer to a dry etching apparatus (Step (A) in FIG. 1), to etch back by dry etching (Step (2') in FIG. 1) and to transfer the substrate from the dry etching apparatus to the coater & developer (Step (A') in FIG. 1).

On the contrary, the process by using the gap fill material forming composition of the present invention can be carried out with one apparatus, and thereby making possible to improve production efficiency compared with the conventional process.

The alkaline aqueous solution used for etch-back is not specifically limited, and alkaline aqueous solutions used as developers for positive type photoresists can be used therefor. For example, they include an aqueous solution of inorganic alkali such as sodium hydroxide, potassium hydroxide, sodium carbonate, sodium silicate, sodium metasilicate or ammonia, etc., an aqueous solution of organic amine such as ethylamine, n-propylamine, diethylamine, triethylamine, dimethylethanolamine or triethanolamine, etc., an aqueous solution of quaternary ammonium salt such as tetramethylammonium hydroxide, tetraethylammonium hydroxide or choline, etc., an aqueous solution of cyclic amine such as pyrrole or piperidine, etc. Furthermore, a suitable amount of alcohols such as isopropyl alcohol or surfactants such as anionic surfactant can be added to the aqueous solution of above-described alkalis. Further, the concentration of the alkaline aqueous solution used is for example 0.1 to 20%, and can be suitably selected therefrom and used. In addition, NMD-3 (manufactured by Tokyo Ohka Kogyo Co., Ltd.) and the like can be used.

The time for etch-back can be suitably selected from 10 to 300 seconds depending on the kind or concentration of the alkaline aqueous solution used, desired film thickness or state of the gap fill material layer, or the like.

In addition, when a gap fill material layer is etched back with an alkaline aqueous solution, the dissolution rate to the alkaline aqueous solution is preferably 3 to 200 nm per second in term of reduction rate of film thickness, or preferably 3 to 100 nm per second, or preferably also 5 to 50 nm. In case where the dissolution rate is higher than the upper limit, it becomes difficult to regulate the amount of the gap fill material layer removed by etch-back, that is, the amount of reduced film thickness. On the other hand, in case where the dissolution rate is lower than the lower limit, the time required for etch-back is prolonged, and thus production efficiency is lowered.

The dissolution rate of the gap fill material layer to the alkaline aqueous solution can be controlled by changing the kind of the polymer contained in the composition used, the content of hydroxy group or carboxy group in the polymer, the kind and added amount of the alkali-dissolution rate regulator added to the composition, and the like.

The dissolution rate of the gap fill material layer to the alkaline aqueous solution is finally determined by a combination of the kind of the gap fill material forming composition, and the kind and concentration of the alkaline aqueous solution.

Figure 2:
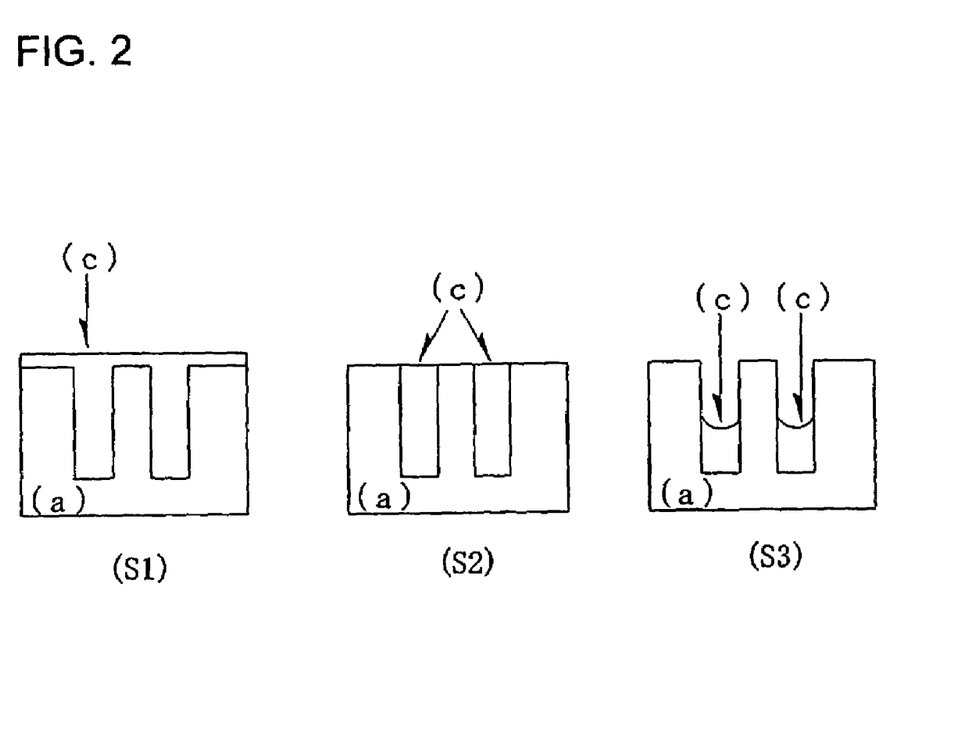
FIG. 2 is a view showing a gap fill material layer after etch-back with an alkaline aqueous solution, in which (a) is a substrate, (b) is a gap fill material layer before etch-back with an alkaline aqueous solution, (c) is a gap fill material layer after etch-back with an alkaline aqueous solution, (d) is an anti-reflective coating layer, and (e) is a photoresist layer.

In addition, state of a gap fill material layer formed on a substrate can be controlled by suitably selecting a condition (the kind of the gap fill material forming composition, the kind and concentration of the alkaline aqueous solution, and time) under which the gap fill material layer is etched back with an alkaline aqueous solution. That is, the selection of etch-back condition can provide a state where the gap fill material layer is present also on the substrate ((S1) in FIG. 2), a state where the gap fill material layer is filled only in the inside of holes on the substrate ((S2) in FIG. 2), or a partial fill-state where the gap fill material layer is filled in a part of holes on the substrate ((S3) in FIG. 2).

The gap fill material layer formed from the gap fill material forming composition according to the present invention is completely removed finally after exposure to light and development of photoresist, and substrate processing, and the like in a process of manufacture of semiconductor device. The removal is generally carried out by dry etching. In the removal by dry etching, it is generally known that the higher the proportion of aromatic ring structure contained in a layer to be removed is, the lower the removal rate is. Therefore, in case where it is desired to raise the removal rate by dry etching, it is preferable to reduce the amount of aromatic ring structure contained in the gap fill material forming composition used. Particularly, it is preferable to reduce the amount of aromatic ring structure contained in the polymer component.

Therefore, when a gap fill material layer with a high removal rate by dry etching is required, a polymer having no aromatic ring structure in the structure thereof is preferably used.

The polymer includes for example polymers produced from only monomers selected from acrylic acid, methacrylic acid, 2-hydroxyethylmethacrylate and vinyl alcohol, etc. In addition, it includes polymers obtained by copolymerizing these monomers with monomers selected from alkyl acrylate or alkyl methacrylate such as methyl acrylate, ethyl acrylate, methyl methacrylate, ethyl methacrylate, isopropyl methacrylate, hexyl methacrylate, etc., alkyl vinyl ether such as ethyl vinyl ether, ethyl butyl ether, etc., alkyl carboxylic acid vinyl ester such as vinyl acetate, vinyl butyrate, etc., N-alkylmaleimide such as N-methylmaleimide, N-cyclohexylmaleimide, etc., maleic anhydride, acrylonitrile, and the like.

For example, the polymer includes polymethacrylic acid, poly(2-hydroxyethyl) methacrylate, polyvinyl alcohol, a copolymerized polymer of acrylic acid with ethyl methacrylate, a copolymerized polymer of vinyl alcohol with butyl vinyl ether, a copolymerized polymer of ethyl methacrylate with 2-hydroxyethyl vinyl ether, a copolymerized polymer of 2-hydroxypropyl methacrylate, propyl acrylate and acrylonitrile, a copolymerized polymer of methacrylic acid, 2-hydroxyethyl methacrylate and ethyl methacrylate, a copolymerized polymer of 2-hydroxyethyl methacrylate, ethyl methacrylate and maleic anhydride, a copolymerized polymer of methacrylic acid, 2-hydroxyethyl methacrylate, methyl methacrylate and N-cyclohexyl maleimide, and the like.

As photoresist to be coated and formed as an upper layer of the gap fill material layer in the present invention, any of negative type and positive type photoresists may be used. The photoresist includes a positive type photoresist consisting of a novolak resin and 1,2-naphthoquinone diazide sulfonic acid ester, a chemically-amplified type resist which consists of a photoacid generator and a binder having a group which is decomposed with an acid and increases alkali dissolution rate, a chemically-amplified type resist consisting of an alkali-soluble binder, a photoacid generator, and a low molecular compound which is decomposed with an acid and increases the alkali dissolution rate of the photoresist, a chemically-amplified resist consisting of a photoacid generator, a binder having a group which is decomposed with an acid and increases the alkali dissolution rate, and a low molecular compound which is decomposed with an acid and increases the alkali dissolution rate of the photoresist. For example, trade name: APEX-E manufactured by Shipley Company, trade name: PAR710 manufactured by Sumitomo Chemical Co., Ltd., and trade name: SEPR430 manufactured by Shinetsu Chemical Co., Ltd., and the like can be mentioned. And, a photoresist is formed, thereafter it can be exposed to light through a predetermined mask, developed, rinsed and dried to obtain a photoresist pattern. If necessary, post exposure bake (PEB) may be performed.

On the gap fill material layer in the present invention, an anti-reflective coating layer may be applied and formed prior to application and forming of the photoresist. The anti-reflective coating layer composition used in such a case is not specifically limited, and can be arbitrarily selected from those conventionally used in the prior lithography process, and used. In addition, the anti-reflective coating can be formed by coating by the conventional method, for example, with a spinner or a coater, and baking. The anti-reflective coating composition includes for example one containing as main components a light absorbing compound, a resin and a solvent, one containing as main components a resin having a light absorbing group through chemical bond, a crosslinking agent and a solvent, one containing as main components a light absorbing compound, a crosslinking agent and a solvent, one containing as main components a polymer crosslinking agent having a light absorbing property and a solvent, and the like. The anti-reflective coating composition may contain an acid component, an acid generator component, a rheology controlling agent, or the like, if necessary. The light absorbing compounds that can be used are any compounds having a high absorption for light at photosensitive characteristic wavelength region of the photosensitive component in the photoresist provided on the anti-reflective coating, and include for example benzophenone compounds, benzotriazole compounds, azo compounds, naphthalene compounds, anthracene compounds, anthraquinone compounds, triazine compounds, and the like. The resins include polyesters, polyimides, polystyrenes, novolak resins, polyacetal resins, (meth)acrylic resins, and the like. The resins having a light absorbing group through chemical bond include resins having a light absorbing aromatic ring structure such as anthracene ring, naphthalene ring, benzene ring, quinoline ring, quinoxaline ring or thiazole ring.

The substrates on which the gap fill material forming composition of the present invention is applied are substrates having holes with an aspect ratio shown in height/diameter of 1 or more (for example, silicon/silicon dioxide coat substrate, silicon nitride substrate, glass substrate, ITO substrate or the like) that are conventionally used in the manufacture of semiconductor device. However, the composition can be used for substrates having holes with an aspect ratio less than 1, or substrates having steps in order to flatten the surface thereof. Further, the composition can be used for substrates having no steps. In the meantime, these substrates may be substrates on which an inorganic anti-reflective coating is formed by CVD method or the like, and the gap fill material forming composition of the present invention can be coated on the substrate The gap fill material layer formed from the gap fill material forming composition of the present invention may contain an absorption for light used in the lithography process. In such a case, the gap fill material layer can act as a layer having a prevent effect against light reflected from the substrate. Further, the gap fill material layer of the present invention can be used as a layer for preventing an interaction between the substrate and the photoresist, as a layer having a function that prevents an adverse effect against the substrate by the material used for the photoresist or by substances formed on exposure to light of the photoresist, or as a layer having a function that prevents diffusion substances formed in the substrate on baking under heating to the upper layer photoresist.

Hereinafter, the present invention will be described based on examples but the present invention is not limited thereto.

EXAMPLE 1

After four monomers: methacrylic acid, 2-hydroxyethyl methacrylate, methyl methacrylate and cyclohexyl maleimide in a molar ratio of 13.5:25.5:25.7:35.3 in total weight of 50 g were dissolved in 200 g of propylene glycol monomethyl ether acetate, nitrogen was flowed to the reaction solution for 30 minutes. While the reaction solution was kept at 70° C., 0.5 g of azobisisobutyronitrile as a polymerization initiator and 0.3 g of 1-dodecane thiol as a chain transfer agent were added and the resulting mixture was stirred under a nitrogen atmosphere. After stirring for 24 hours, 0.1 g of 4-methoxyphenol as a short-stop was added thereto.

To 490.3 g of the resulting polymer solution having a solid content concentration of 23.1%, 25.5 g of 20% propylene glycol monomethyl ether acetate solution of epoxidized butane tetracarboxylic acid tetrakis-(3-cyclohexenylmethyl) modified e-caprolactone (manufactured by Nagase ChemteX Corporation, trade name: GT-401), 34.0 g of 3,4,5-naphthoquinone diazide-5-sulfonyl methyl benzoate (manufactured by Toyo Gosei Co.,Ltd., trade name: NMG-300), 5.1 g of γ-methacryloxy propyltrimethoxysilane, and as a surfactant 5.1 g of 1% propylene glycol monomethyl ether acetate solution of R-30 (manufactured by Dainippon Ink and Chemicals Incorporated) were mixed, and further 124.2 g of propylene glycol monomethyl ether acetate was mixed thereto to obtain 23.0% solution. Then, the resulting solution was filtered through a micro filter made of polyethylene having a pore diameter of 0.05 μm, to prepare a gap fill material forming composition solution for lithography.

The resulting solution was coated on a silicon wafer by means of a spinner. The coated silicon wafer was heated at 120° C. for 1 minute on a hot plate to form a gap fill material layer for lithography (film thickness 1.1 µm). The gap fill material layer was dipped in 2.38% tetramethylammonium hydroxide aqueous solution for a predetermined time, and alkali-dissolution rate was measured. The alkali-dissolution rate was 18 nm per second when calculated from the dipping time and reduced amount in film thickness.

The resulting solution was coated on a silicon wafer by means of a spinner. The coated silicon wafer was baked at 120° C. for 1 minute and then 205° C. for 1 minute on a hot plate to form a gap fill material layer for lithography (film thickness 1.0 µm). The gap fill material layer was dipped in a solvent used for a photoresist, such as ethyl lactate, and propylene glycol monomethyl ether, and it was confirmed that the layer was insoluble in the solvent.

The resulting solution was coated on a silicon wafer having holes (diameter: 0.18 µm, depth: 1.1 µm) by means of a spinner. The coated silicon wafer was heated at 120° C. for 1 minute on a hot plate to form a gap fill material layer for lithography (film thickness 1.1 µm). The flattening property of the resulting gap fill material layer for lithography was assessed by observing with a scanning electron microscope (SEM) the sectional form of the silicon wafer substrate having holes on which the gap fill material layer was formed. The hole-bedding property of the resulting gap fill material layer for lithography was good as there was no void nor gap in the holes.

Further, the gap fill material layer applied and formed on a silicon wafer having holes was dipped in 2.38% tetramethyl ammonium hydroxide aqueous solution for 55 seconds, and then was heated at 205° C. for 1 minute on a hot plate. The flattening property of the resulting gap fill material layer for lithography was assessed by observing with a scanning electron microscope (SEM) the sectional form of the silicon wafer substrate having holes on which the gap fill material layer was formed. The hole-bedding property of the resulting gap fill material layer for lithography was good as there was no void nor gap in the holes, and a high flattening property was accomplished. This is attributable to that a high flattening property is obtained due to a high fluidity of the gap fill material forming composition for lithography and that the gap fill material forming composition for lithography has a suitable alkali-dissolution rate in an etch-back process with an alkaline aqueous solution.

EXAMPLE 2

After 106.8 g of 1% propylene glycol monomethyl ether acetate solution of a surfactant R-30 (manufactured by Dainippon Ink and Chemicals Incorporated) was added to a mixture of 47.5 g of a copolymerized polymer of 4-hydroxystyrene with methyl acrylate (polymerization ratio of 25:75, Maruzen Petrochemical, trade name: Maruka Lyncur CMA30), 16.96 g of tetrabutoxymethylbenzoguanamine (manufactured by Mitsui Cytec Co., Ltd., trade name: Mycoat 1128), 0.033 g of pyridinium-p-toluene sulfonic acid and 106.8 g of ethyl lactate to obtain 22% solution, the resulting solution was filtered through a micro filter made of polyethylene having a pore diameter of 0.05 µm, to prepare a gap fill material forming composition solution for lithography.

The resulting solution was coated on a silicon wafer by means of a spinner. The coated silicon wafer was heated at 145° C. for 1 minute on a hot plate to form a gap fill material layer for lithography (film thickness 1.0 µm). The gap fill material layer was dipped in 2.38% tetramethylammonium hydroxide aqueous solution for a predetermined time, and alkali-dissolution rate was measured. The alkali-dissolution rate was 5.0 nm per second when calculated from the dipping time and reduced amount in film thickness.

The resulting solution was coated on a silicon wafer by means of a spinner. The coated silicon wafer was heated at 135° C. for 1 minute on a hot plate to form a gap fill material layer for lithography (film thickness 1.0 µm). The gap fill material layer was dipped in 2.38% tetramethylammonium hydroxide aqueous solution for a predetermined time, and alkali-dissolution rate was measured. The alkali-dissolution rate was 9.0 nm per second when calculated from the dipping time and reduced amount in film thickness.

The resulting solution was coated on a silicon wafer by means of a spinner. The coated silicon wafer was heated at 135° C. for 1 minute or 145° C. for 1 minute and then 205° C. for 1 minute on a hot plate to form a gap fill material layer for lithography (film thickness 1.0 µm). The gap fill material layer was dipped in a solvent used for a photoresist, such as ethyl lactate, and propylene glycol monomethyl ether, and it was confirmed that the layer was insoluble to the solvent.

The resulting solution was coated on a silicon wafer having holes (diameter: 0.13 µm, depth: 0.8 µm) by means of a spinner. The coated silicon wafer was heated at 120° C. for 1 minute on a hot plate to form a gap fill material layer for lithography (film thickness 1.0 µm). The flattening property of the resulting gap fill material layer for lithography was assessed by observing with a scanning electron microscope (SEM) the sectional form of the silicon wafer substrate having holes on which the gap fill material layer was formed. The hole-bedding property of the resulting gap fill material layer for lithography was good as there was no void nor gap in the holes.

EXAMPLE 3

After 2.18 g of tetramethoxymethylbenzoguanamine (manufactured by Mitsui Cytec Co., Ltd., trade name: Cymel 1123), 0.00393 g of pyridinium-p-toluene sulfonic acid, 0.0496 g of a surfactant R-30 (manufactured by Dainippon Ink and Chemicals Incorporated), 0.50 g of Epotohto YH434L (manufactured by Tohto Kasei Co., Ltd.), 4.7 g of propylene glycol monomethyl ether acetate and 32.23 g of ethyl lactate were added to 20.0 g of ethyl lactate solution in which a dextrin ester compound GS-Ac2 (proportion of terminal groups of dextrin: 2-carboxyethylcarbonyloxy group: 2.5%, hydroxy group: 17.5%, acetoxy group: 80%, weight average molecular weight: 7400, manufactured by Gunei Chemical Industry Co., Ltd.) was dissolved in a solid content concentration of 49.6%, to obtain 18.0% solution, the resulting solution was filtered through a micro filter made of polyethylene having a pore diameter of 0.05 µm, to prepare a gap fill material forming composition solution for lithography.

The resulting solution was coated on a silicon wafer by means of a spinner. The coated silicon wafer was heated at 175° C. for 1 minute on a hot plate to form a gap fill material layer for lithography (film thickness 1.0 µm). The gap fill material layer was dipped in 2.38% tetramethylammonium hydroxide aqueous solution for a predetermined time, and alkali-dissolution rate was measured. The alkali-dissolution rate was 50 nm per second when calculated from the dipping time and reduced amount in film thickness.

The resulting solution was coated on a silicon wafer by means of a spinner. The coated silicon wafer was heated at 175° C. for 1 minute and then 205° C. for 1 minute on a hot plate to form a gap fill material layer for lithography (film thickness 1.0 µm). The gap fill material layer was dipped in a solvent used for a photoresist, such as ethyl lactate, and propylene glycol monomethyl ether, and it was confirmed that the layer was insoluble to the solvent.

The resulting solution was coated on a silicon wafer having holes (diameter: 0.13 μm, depth: 0.8 μm) by means of a spinner. The coated silicon wafer was heated at 175° C. for 1 minute on a hot plate to form a gap fill material layer (film thickness 1.0 μm). The flattening property of the resulting gap fill material layer for lithography was assessed by observing with a scanning electron microscope (SEM) the sectional form of the silicon wafer substrate having holes on which the gap fill material layer was formed. The hole-bedding property of the resulting gap fill material layer for lithography was good as there was no void nor gap in the holes.

The invention claimed is:

1. A gap fill material forming composition for manufacturing semiconductor devices by coating a photoresist on a substrate having a hole with an aspect ratio of 1 or more shown in height/diameter, transferring an image to the substrate using a lithography process, coating the composition on the substrate, baking the composition, contacting the composition with an alkaline aqueous solution after baking, and coating the photoresist, the composition comprising:
   a polymer having a hydroxy group or a carboxy group;
   a crosslinking agent; and
   an alkali-dissolution rate regulator selected from the group consisting of naphthoquinone compounds, compounds having a t-butoxycarbonyl group, compounds having a hydroxy group, compounds having a carboxy group, and compounds having a phenyl group,
   wherein a gap fill material layer manufactured by coating and baking the gap fill material forming composition on a semiconductor substrate has a dissolution rate ranging from 3 to 200 nm per second for an alkaline aqueous solution having a concentration of 0.1% to 20%.

2. The gap fill material forming composition according to claim 1, wherein the polymer has a weight average molecular weight of 500 to 30000.

3. The gap fill material forming composition according to claim 1, wherein the polymer is a polymer containing repeating unit having a hydroxy group or a carboxy group in main chain.

4. The gap fill material forming composition according to claim 1, wherein the polymer is a polymer containing repeating unit having a hydroxy group or a carboxy group in side chain.

5. The gap fill material forming composition according to claim 1, wherein the polymer is a polymer containing acrylic acid or methacrylic acid as repeating unit.

6. The gap fill material forming composition according to claim 1, wherein the polymer is a polymer containing hydroxyalkyl acrylate or hydroxyalkyl methacrylate as repeating unit.

7. The gap fill material forming composition according to claim 1, wherein the polymer is a dextrin ester compound.

8. The gap fill material forming composition according to claim 1, wherein the polymer is a polymer containing hydroxystyrene as repeating unit.

9. The gap fill material forming composition according to claim 1, wherein the polymer has no aromatic ring structure in the structure.

10. The gap fill material forming composition according to claim 1, wherein the crosslinking agent is a crosslinking agent having at least two crosslink-forming functional groups.

11. A method for forming a gap fill material layer for use in manufacture of semiconductor device comprising coating the gap fill material forming composition according to claim 1 on a substrate and baking it.

* * * * *